United States Patent
Kumada et al.

(10) Patent No.: US 9,224,536 B2
(45) Date of Patent: Dec. 29, 2015

(54) VARIABLE CAPACITANCE DEVICE

(75) Inventors: Akira Kumada, Nagaokakyo (JP); Teruhisa Shibahara, Nagaokakyo (JP); Kenji Tanaka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 601 days.

(21) Appl. No.: 13/568,172

(22) Filed: Aug. 7, 2012

(65) Prior Publication Data

US 2013/0201599 A1 Aug. 8, 2013

Related U.S. Application Data

(63) Continuation of application No. PCT/JP2011/052208, filed on Feb. 3, 2011.

(30) Foreign Application Priority Data

Feb. 8, 2010 (JP) .................................. 2010-025255

(51) Int. Cl.
  *H01G 5/00* (2006.01)
  *H01G 7/00* (2006.01)
  (Continued)

(52) U.S. Cl.
  CPC .. *H01G 5/16* (2013.01); *H03J 3/20* (2013.01); *H03J 2200/19* (2013.01)

(58) Field of Classification Search
  CPC ......... H01G 5/18; H01G 5/16; G01N 27/223; G01D 5/2417; H01H 59/0009
  USPC .................. 361/281, 280, 277, 331; 324/661; 200/181; 381/174
  See application file for complete search history.

(56) References Cited

U.S. PATENT DOCUMENTS

2003/0006669 A1   1/2003   Pei et al.
2004/0075158 A1*  4/2004   Nakayama ................... 257/532
(Continued)

FOREIGN PATENT DOCUMENTS

CN   1476619 A      2/2004
CN   101576588 A    11/2009
(Continued)

OTHER PUBLICATIONS

Official Communication issued in International Patent Application No. PCT/JP2011/052208, mailed on Apr. 19, 2011.
(Continued)

*Primary Examiner* — Eric Thomas
*Assistant Examiner* — Arun Ramaswamy
(74) *Attorney, Agent, or Firm* — Keating & Bennett, LLP (57) ABSTRACT

A variable capacitance device that achieves a desired capacitance even when factors causing varied capacitances are generated is configured such that a capacitance detection pulse signal is applied from a capacitance detection signal generation unit to a driving capacitor and a reference capacitor of a MEMS mechanical unit. The device voltage of the driving capacitor based on the capacitance detection signal and a driving voltage is applied to the inverting input terminal of a comparator. The device voltage of the reference capacitor based on the capacitance detection signal and the driving voltage is applied to the non-inverting input terminal of the comparator. The comparator generates a comparison output signal including "Hi" and "Low" values from the difference between these device voltages, and applies the output signal to a driving voltage generation unit. The driving voltage generation unit increases or decreases the driving voltage based on the comparison output signal.

5 Claims, 8 Drawing Sheets

(51) Int. Cl.
 *H01G 7/06* (2006.01)
 *H01H 57/00* (2006.01)
 *G01R 27/26* (2006.01)
 *H01G 5/16* (2006.01)
 *H03J 3/20* (2006.01)

(56) References Cited

U.S. PATENT DOCUMENTS

2007/0281646 A1* 12/2007 Itaya et al. ................ 455/197.2
2009/0066299 A1   3/2009 Suzuki

FOREIGN PATENT DOCUMENTS

| EP | 1 950 778 A2 | 7/2008 |
|---|---|---|
| JP | 2004-172504 A | 6/2004 |
| JP | 2004-327877 A | 11/2004 |
| JP | 2005-522162 A | 7/2005 |
| JP | 2005-246498 A | 9/2005 |
| JP | 2007-003300 A | 1/2007 |
| JP | 2007-324336 A | 12/2007 |
| JP | 2008-157917 A | 7/2008 |
| JP | 2008-181725 A | 8/2008 |
| JP | 2009-070940 A | 4/2009 |

OTHER PUBLICATIONS

Official Communication issued in corresponding Chinese Patent Application No. 201180008734.9, mailed on Aug. 29, 2014.

* cited by examiner

VARIABLE CAPACITANCE DEVICE

BACKGROUND OF THE INVENTION

1. Field of the Invention

The present invention relates to variable capacitance devices including a MEMS structure, and specifically to variable capacitance devices that include a control circuit that electrically controls a distance between opposing electrodes.

2. Description of the Related Art

Currently, many attempts are being made to apply variable capacitance devices that use a MEMS structure to, for example, matching circuits in the front end portions of wireless communication high-frequency modules for cellular phones.

A variable capacitance device that uses a MEMS structure includes a mechanical unit that actually functions as a variable capacitance device and a driving circuit that applies a driving voltage to the mechanical unit, as described in Japanese Unexamined Patent Application Publication No. 2008-181725 and Japanese Unexamined Patent Application Publication No. 2009-70940.

The mechanical unit includes a fixed flat plate and a movable flat plate made of, for example, silicon. One end or both ends of the movable plate are supported by fixed members, thereby forming a cantilever or doubly supported beam, and as a result of this structure, the movable plate is arranged so as to be spaced apart from the fixed plate by a predetermined distance and so as to be partially movable. A pair of driving electrodes and a pair of opposing electrodes which function as a variable capacitor are formed so as to respectively face each other on the fixed plate and the movable plate in a range in which the movable plate moves.

When a predetermined driving voltage is applied to the pair of driving electrodes by the driving circuit, the driving electrodes are attracted to each other by an electrostatic attraction, whereby the movable plate deforms. As a result, the distance between the driving electrodes is decreased and the distance between the opposing electrodes for variable capacitance is also decreased accordingly. Hence, the capacitance of the variable capacitance device becomes higher than when the driving voltage was not being applied. On the other hand, when application of the driving voltage is stopped, the electrostatic attraction between the driving electrodes is lost, and the distance between the opposing driving electrodes for variable capacitance returns to the original state prior to the application of the driving voltage because of a restoring force of the movable portion. As a result, the capacitance of the variable capacitance device becomes lower than when the driving voltage was being applied.

When the variable capacitance device is used in a matching circuit for high-frequency communication, as described above, it is preferable to realize as many capacitance values as possible in order to widen the range of matching and increase the capacitance resolution for matching.

Here, when three or more capacitance values are to be obtained, it is necessary to use a configuration in which a plurality of variable capacitance devices with a structure providing two capacitance values are formed and connected in parallel or to make a single variable capacitance device have a structure that provides three or more capacitance values.

A variable capacitance device providing two capacitance values can be realized using a simple structure and control in which opposing driving electrodes for variable capacitance are made to contact each other with, for example, a dielectric layer therebetween through application of a driving voltage, and the opposing driving electrodes for variable capacitance are separated from each other by stopping the application of a driving voltage.

However, when multiple values of capacitance are realized using such variable capacitance devices providing only two capacitance values, many variable capacitance devices need to be formed and, in addition, circuit patterns for connecting these devices need to be formed. As a result, reductions in size and space are difficult. Further, the amount of signal loss due to the connection patterns cannot be ignored.

On the other hand, when multiple values of capacitance are realized using a single capacitance device, reductions in size and space can be realized. To put it simply, adjustment of a driving voltage allows adjustment of the distance between opposing electrodes for variable capacitance, i.e., the distance between driving electrodes, in accordance with capacitance, whereby multiple values of capacitance are realized. In addition, since the circuit patterns for connecting a plurality of capacitors in parallel are not required, signal loss can be minimized.

However, with existing configurations, it is actually not easy to control the driving voltage so as to maintain the capacitance at a constant value because of, for example, the aging deterioration of a movable plate, self actuation, variations in the driving voltage, and instantaneous deformation of the movable plate due to external factors.

SUMMARY OF THE INVENTION

Preferred embodiments of the present invention provide a variable capacitance device that can reliably provide a desired capacitance even when factors that cause the capacitance to vary are generated.

A preferred embodiment of the present invention relates to a variable capacitance device including a fixed plate, a movable plate, and a driving voltage applying unit. The fixed plate is provided with a first driving electrode and a first variable capacitance electrode. The movable plate is provided with a second driving electrode facing the first driving electrode and a second variable capacitance electrode facing the first variable capacitance electrode. The driving voltage applying unit applies a driving voltage between the first driving electrode and the second driving electrode.

The variable capacitance device further includes a reference capacitor having a predetermined capacitance, a capacitance detection signal generation unit, and a voltage change comparator. The capacitance detection signal generation unit applies a capacitance detection pulse signal to a driving capacitance portion including the first driving electrode and the second driving electrode and to the reference capacitor. The voltage change comparator compares a voltage change of the driving capacitance portion and a voltage change of the reference capacitor caused by the capacitance detection pulse signal and outputs a comparison result. The driving voltage applying unit controls the driving voltage on the basis of the comparison result.

This configuration utilizes the fact that there is a one to one correspondence between the capacitance of the driving capacitance portion generated by the first driving electrode and the second driving electrode and a capacitance generated by the first variable capacitance electrode and the second variable capacitance electrode that function as the opposing electrodes of the variable capacitance device. The difference between the voltage of the reference capacitor, which has been set in accordance with the capacitance of the driving capacitance portion corresponding to a desired capacitance which is to be realized by the variable capacitance device, and the voltage of the driving capacitance portion is reflected in the driving voltage, and the driving voltage is controlled so as to make the voltage difference be zero. This enables control to make the capacitance of the variable capacitance device have a desired value. The use of a pulse signal for capacitance detection at this time enables a reduction in the influence of a capacitance detection operation on the variable capacitance. That is, it takes a certain response time after the voltage is applied for the movable portion, which has a predetermined strength and a predetermined elasticity, to be displaced by an amount of displacement corresponding to the applied voltage. Hence, by making the duration of the capacitance detection pulse signal be shorter than this response time, generation of the mechanical response of the movable portion can be limited to a minimum. Further, an electric charge supplied by the pulse signal to the driving electrode is negligibly small compared with an electric charge due to the driving voltage that is actually applied for driving. Hence, there is a negligible influence of the pulse signal for capacitance detection on the actual driving of the movable portion.

The variable capacitance device according to a preferred embodiment of the present invention further includes an offset compensation signal generation unit that applies a compensation signal obtained by reversing the sign of the capacitance detection pulse signal to the driving capacitance portion and the reference capacitor.

With this configuration, since the compensation signal is a signal obtained by reversing the sign of the capacitance detection pulse signal, the electric charge stored by the capacitance detection pulse signal in the driving capacitance portion and the reference capacitor can be removed from the driving capacitance portion and the reference capacitor by applying the compensation signal to the driving capacitance portion and the reference capacitor. As a result, by making the removed electric charge be the same as the stored electric charge, for example, there remains no electric charge due to the capacitance detection signal. Hence, even when the voltages of the driving portion and the reference capacitor are continuously detected at predetermined intervals, accurate voltages are obtained at every detection interval such that accurate driving is realized.

The variable capacitance device according to a preferred embodiment of the present invention further includes a timing generation unit that applies application timing signals to the capacitance detection signal generation unit and the offset compensation signal generation unit. The capacitance detection signal generation unit and the offset compensation signal generation unit apply the respective signals in accordance with the timing signals.

With this configuration, by applying the capacitance detection pulse signal and the compensation signal to the driving capacitance portion and the reference capacitor using the timing signals, accurate voltage detection and driving are always possible.

The variable capacitance device according to a preferred embodiment of the present invention further includes a sample/hold circuit on an input side or an output side of the voltage change comparator. The timing generation unit provides a hold timing to the sample/hold circuit, and the sample/hold circuit samples and holds the voltages of the driving capacitance portion and the reference capacitor or a voltage indicating the comparison result output from the voltage change comparator on the basis of the provided hold timing.

By providing a sample/hold circuit in this manner, a voltage difference and a comparison result that are reliable and accurate can be obtained at a desired timing.

The variable capacitance device according to a preferred embodiment of the present invention further includes a current ratio control unit that controls a ratio of a current supplied to the driving capacitance portion to a current supplied to the reference capacitor.

With this configuration, as a result of the ratio of the current supplied to the driving capacitance portion to the current supplied to the reference capacitor being variable, a plurality of the states of the driving capacitance portion can be set using a single reference capacitor. As a result, the variable capacitance device can be controlled to provide a plurality of capacitances using a single reference capacitor.

According to various preferred embodiments of the present invention, a desired capacitance is reliably obtained even when the factors that cause the capacitance to vary are generated in a variable capacitance device.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
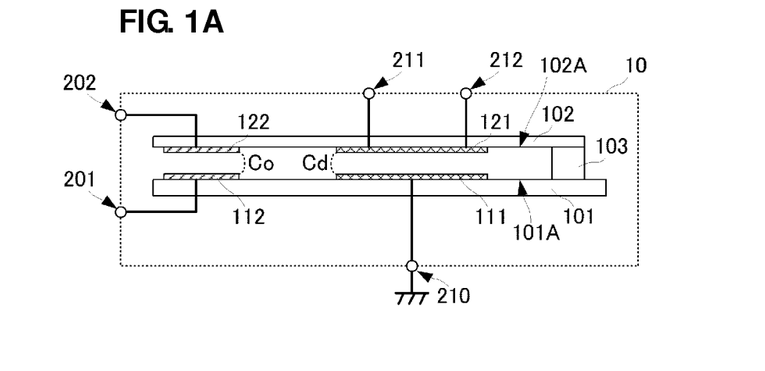
FIGS. 1A and 1B include a schematic configuration diagram of a MEMS mechanical unit and a circuit block diagram of the entire configuration of a variable capacitance device according to a first preferred embodiment of the present invention.
Figure 1B:
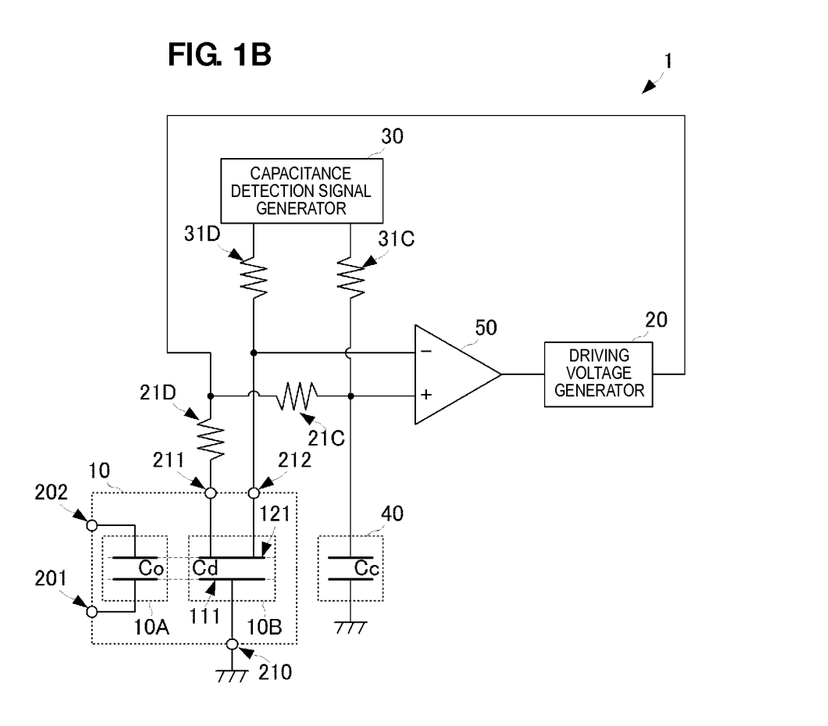

A variable capacitance device according to a first preferred embodiment of the present invention will be described with reference to the drawings. FIG. 1A is a schematic configuration diagram of a MEMS mechanical unit 10 of a variable capacitance device 1 of the present preferred embodiment, and FIG. 1B is a circuit block diagram of the entire configuration of the variable capacitance device 1.

First, the configuration of the MEMS mechanical unit 10 of the variable capacitance device 1 will be described.

The MEMS mechanical unit 10 includes a fixed plate 101, a movable plate 102, and a fixed portion 103. The fixed plate 101 and the movable plate 102 are planar plates with predetermined thicknesses. Note, however, that the movable plate 102 preferably has a thickness that allows for displacement caused by application of a driving voltage described later. The fixed plate 101 and the movable plate 102 are preferably made of a material such as silicon, and specifically in the configuration of the present preferred embodiment, are preferably made of a high-resistivity material.

The fixed plate 101 and the movable plate 102 are arranged such that the respective planar surfaces (main surfaces) face each other with a predetermined distance therebetween. A predetermined end of the movable plate 102 is connected to the fixed plate 101 through the fixed portion 103. The fixed portion 103 is also preferably made of a material such as silicon similarly to the fixed plate 101 and the movable plate 102. In this case, it is preferable to use a low-conductivity high-resistance silicon material as a silicon material to maintain insulation between the electrodes. Alternatively, when a low-resistance silicon material is used, insulating films may be provided on portions of the surface of the silicon material where the electrodes are located.

On a main surface 101A of the fixed plate 101 on the movable plate 102 side, a first driving electrode 111 and a first variable capacitance forming electrode 112 are provided. On the other hand, on a main surface 102A of the movable plate 102 on the fixed plate 101 side, a second driving electrode 121 and a second variable capacitance forming electrode 122 are provided. Here, the first driving electrode 111 of the fixed plate 101 and the second driving electrode 121 of the movable plate 102 are arranged to face each other over a predetermined area. The first variable capacitance forming electrode 112 of the fixed plate 101 and the second variable capacitance forming electrode 122 of the movable plate 102 are arranged to face each other over a predetermined area.

With this configuration, the first driving electrode 111 of the fixed plate 101 and the second driving electrode 121 of the movable plate 102 define a driving capacitor 10B (capacitor with a capacitance Cd in FIGS. 1A and 1B). Further, the first variable capacitance forming electrode 112 of the fixed plate 101 and the second variable capacitance forming electrode 122 of the movable plate 102 define a externally connected capacitor 10A (capacitor with a capacitance Co in FIGS. 1A and 1B) of the variable capacitance device 1.

Here, the distance between the fixed plate 101 and the movable plate 102, the opposing area of the first driving electrode 111 and the second driving electrode 121, and the opposing area of the first variable capacitance forming electrode 112 and the second variable capacitance forming electrode 122 are determined on the basis of the capacitance Co that needs to be realized by the variable capacitance device 1.

In addition to the mechanical configuration described above, the MEMS mechanical unit 10 includes a ground port 210 that is electrically connected to the first driving electrode 111. Further, the MEMS mechanical unit 10 includes a driving signal input port 211 and a detection signal input port 212 electrically connected to the second driving electrode 121. Further, the MEMS mechanical unit 10 includes a first external connection port 201 that is electrically connected to the first variable capacitance forming electrode 112 and a second external connection node 202 that is electrically connected to the second variable capacitance forming electrode 122. Note that, although not illustrated, wiring electrode patterns that connect the ports to the respective electrodes are preferably provided and appropriately arranged on the fixed plate 101, the movable plate 102, and the fixed portion 103 to realize the above-described connection configuration. These ports are examples used for descriptive purposes, and need not be individually formed as actual circuit-forming patterns specifically and separately from other circuits. Further, although there may be a case in which a casing to house the MEMS mechanical unit 10 is provided and a via hole to connect each port to the outside of the casing is provided in the casing, these are omitted in the present preferred embodiment.

With this configuration, in a default state where no driving current is supplied and, hence, there is no electrostatic attraction, the first variable capacitance forming electrode 112 and the second variable capacitance forming electrode 122 are in a state of being separated from each other by a predetermined distance, such that a capacitor having the capacitance Co is realized with the first external connection port 201 and the second external connection node 202 as the two terminals thereof.

In this configuration, when the ground port 210 is connected to the ground and a predetermined driving voltage is applied to the driving signal input port 211, an electrostatic attraction is generated between the first driving electrode 111 and the second driving electrode 121. This electrostatic attraction causes the movable plate 102 to be bent toward the fixed plate 101, such that the distance between the fixed plate 101 and the movable plate 102 is decreased. As a result, the distance between the first variable capacitance forming electrode 112 and the second variable capacitance forming electrode 122 is decreased and the capacitance Co becomes higher than in the state where the driving voltage is not applied.

At this time, the electrostatic attraction is changed by changing the magnitude of the driving voltage. As a result, the distance between the first driving electrode 111 and the second driving electrode 121 is changed and the capacitance Co corresponding to the distance is realized. In other words, the capacitance Co with a value among a plurality of values corresponding to the magnitudes of the driving voltage is obtained by the MEMS mechanical unit 10 including the pair of the electrode pairs.

When application of the driving voltage is stopped, for example, the electrostatic attraction is removed with a predetermined time constant, and the fixed plate 101 returns to the above-described default state. As a result, the distance between the first variable capacitance forming electrode 112 and the second variable capacitance forming electrode 122 becomes larger than in the state where the driving voltage is being applied, whereby the capacitance Co is decreased.

In this manner, the variable capacitance device with a MEMS structure is mechanically formed.

In addition to the MEMS mechanical unit 10 having the configuration described above, the variable capacitance device 1 of the present preferred embodiment includes a circuit illustrated in FIG. 1B.

Referring to FIG. 1B, the variable capacitance device 1 includes the MEMS mechanical unit 10, a driving voltage generation unit 20, a capacitance detection signal generation unit 30, a reference capacitor 40, and a comparator 50.

The output end of the driving voltage generation unit 20 connected to the second driving electrode 121 of the driving capacitor 10B through a resistor 21D and the driving signal input port 211 of the MEMS mechanical unit 10. Note that the first driving electrode 111 is connected to the ground through the ground port 210.

The output end of the driving voltage generation unit 20 is also connected to one end of the reference capacitor 40 through a resistor 21C. Note that the other end of the reference capacitor 40 is connected to the ground.

The capacitance detection signal generation unit 30 is connected to the second driving electrode 121 of the driving capacitor 10B through a resistor 31D and the detection signal input port 212 of the MEMS mechanical unit 10.

The capacitance detection signal generation unit 30 is also connected to one end of the reference capacitor 40 through a resistor 31C. Note that the other end to the reference capacitor 40 is connected to the ground.

The inverting input terminal of the comparator 50 is connected to the detection signal input port 212 of the MEMS mechanical unit 10, i.e., a connection node between the second driving electrode 121 of the driving capacitor 10B and the resistor 31D. On the other hand, the non-inverting input terminal of the comparator 50 is connected to a connection node between one end of the reference capacitor 40 and the resistor 31C.

The output of the comparator 50 is connected to the input end of the driving voltage generation unit 20.

Figure 2A:
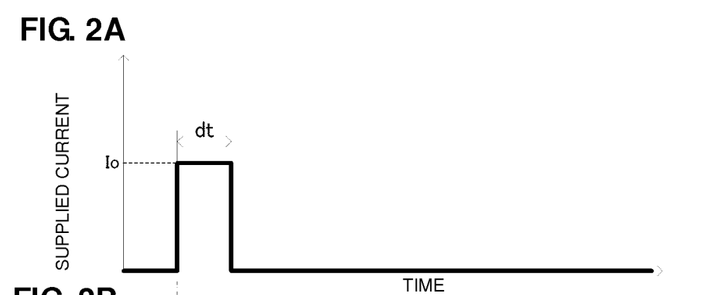
FIGS. 2A-2C are diagrams explaining the principle of variable-capacitance control of the first preferred embodiment of the present invention.
Figure 2B:
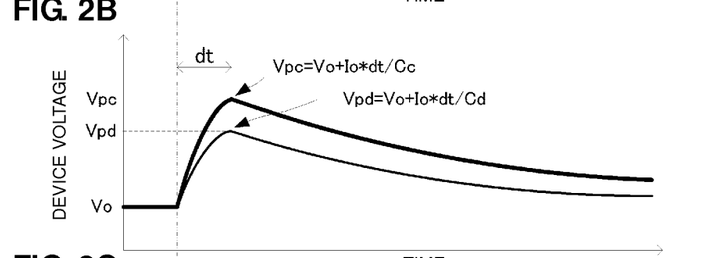
Figure 2C:
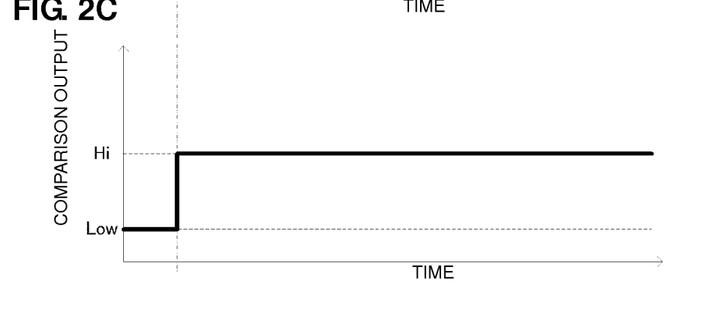

Using the circuit configuration described above, the variable capacitance is controlled, as will be described below. FIGS. 2A-2C include diagrams explaining the principle of variable capacitance control. FIG. 2A is a current waveform diagram of a capacitance detection signal, and FIG. 2B is a waveform diagram illustrating the device voltages of the driving capacitor 10B and the reference capacitor 40. FIG. 2C is a waveform diagram of the comparison output of the comparator.

In the initial state, the driving voltage generation unit 20 generates a driving voltage having a predetermined set value. This driving voltage is applied to the driving capacitor 10B and the reference capacitor 40. The movable plate 102 that defines the driving capacitor 10B is displaced in accordance with the driving voltage, and the capacitance Co of the externally connected capacitor 10A is determined in accordance with the displacement.

In the driving state described above, a capacitance detection signal is applied from the capacitance detection signal generation unit 30 to the driving capacitor 10B and the reference capacitor 40 in synchronization. The capacitance detection signal is a pulse signal illustrated in FIG. 2A. More specifically, the capacitance detection signal is a pulse signal that has a current of a predetermined value Io only during an application period that is a predetermined period of time dt and a value "0" during the other period.

When the capacitance detection signal is applied together with the driving voltage in this manner, device voltages illustrated in FIG. 2B are generated in the driving capacitor 10B and the reference capacitor 40 in accordance with the driving voltage and the current of the capacitance detection signal. In FIG. 2B, Vo denotes the driving voltage, Vpc denotes the peak value of the device voltage of the reference capacitor 40, and Vpd denotes the peak value of the device voltage of the driving capacitor 10B.

Specifically, when only the driving voltage is applied to the driving capacitor 10B, the device voltage is the same as the driving voltage Vo, as illustrated in FIG. 2B. When the capacitance detection signal is applied to the driving capacitor 10B in this state, the device voltage changes in accordance with the current Io. When the resistor 21D has a sufficiently larger resistance than the resistor 31D, the device voltage of the driving capacitor 10B starts to increase at the timing of applying the capacitance detection signal, and the peak value Vpd of the device voltage at the end of the application period of dt is given by the following equation.

$$Vpd = Vo + Io \cdot dt / Cd$$

After that, the device voltage of the driving capacitor 10B decreases with a time constant that depends on the capacitance Cd of the driving capacitor 10B and the resistance of the resistor 21D.

On the other hand, when only the driving voltage is applied to the reference capacitor 40, the device voltage is the same as the driving voltage Vo as illustrated in FIG. 2B similarly to the driving capacitor 10B. When the capacitance detection signal is applied to the reference capacitor 40 in this state, the device voltage changes in accordance with the current Io. When the resistor 21C has a sufficiently larger resistance than the resistor 31C, the device voltage of the reference capacitor 40 starts to increase at the timing of applying the capacitance detection signal, and the peak value Vpc of the device voltage at the end of the application period of dt is given by the following equation.

$$Vpc = Vo + Io \cdot dt / Cc$$

After that, the device voltage of the reference capacitor 40 decreases with a time constant that depends on the capacitance Cc of the reference capacitor 40 and the resistance of the resistor 21C.

Here, a setting is made in advance such that the capacitance Cc of the reference capacitor 40 is the same as the capacitance Cd of the driving capacitor 10B when the externally connected capacitor 10A has a desired value of the capacitance Co.

In this state, theoretically, the driving capacitor 10B and the reference capacitor 40 are supposed to have the same device voltage, as described above. However, when the changes in the voltages of the two devices are different from each other as illustrated in FIG. 2B due to, for example, the aging deterioration of the MEMS mechanical unit 10, self actuation, and external factors, this means that the capacitance does not have a value that makes the capacitance Co of the externally connected capacitor 10A have a desired value. The difference from a desired capacitance has a one to one correspondence with the difference between the device voltages. For example, the larger the difference from a desired capacitance, the larger the difference between the device voltages, and the smaller the difference from a desired capacitance, the smaller the difference between the device voltages. Hence, the difference between the device voltages becomes an index indicating a difference from a desired capacitance.

By utilizing this relationship, the comparator 50 outputs a comparison output signal illustrated in FIG. 2C on the basis of the obtained difference between the device voltage of the driving capacitor 10B and the device voltage of the reference capacitor 40. The comparison output signal is a binary signal having either a "Hi" level or a "Low" level. In the present preferred embodiment, since the device voltage of the driving capacitor 10B is input to the inverting input terminal of the comparator 50 and the device voltage of the reference capacitor 40 is input to the non-inverting input terminal of the comparator 50, the comparator 50 generates a comparison output signal at the "Hi" level when the device voltage of the reference capacitor 40 is higher than the device voltage of the driving capacitor 10B, and generates a comparison output signal at the "Low" level when the device voltage of the reference capacitor 40 is lower than the device voltage of the driving capacitor 10B.

The driving voltage generation unit 20 controls the driving voltage in accordance with the level of the comparison output signal supplied by the comparator 50. Specifically, in the present preferred embodiment, when a comparison output signal at the "Hi" level is input, the driving voltage generation unit 20 decreases the driving voltage by a predetermined amount, thereby performing control such that the driving voltage is decreased. As a result, the driving voltage applied to the driving capacitor 10B is decreased and an electrostatic attraction between the first driving electrode 111 and the second driving electrode 121 is decreased, such that the distance between these electrodes is increased. Hence, the capacitance Cd of the driving capacitor 10B is decreased and the device voltage is increased, such that the device voltage approaches the device voltage of the reference capacitor 40. Through control of the driving voltage in this manner, when the driving voltage is controlled such that the device voltage of the driving capacitor 10B and the device voltage of the reference capacitor 40 become the same, the capacitance Co of the externally connected capacitor 10A can be controlled to become a desired capacitance.

On the other hand, in a state opposite to that in FIGS. 2A-2C, when a comparison output signal at the "Low" level is input, the driving voltage generation unit 20 increases the driving voltage by a predetermined amount, thereby performing control such that the driving voltage is increased. As a result, the driving voltage applied to the driving capacitor 10B is increased and an electrostatic attraction between the first driving electrode 111 and the second driving electrode 121 is increased such that the distance between these electrodes is decreased. Hence, the capacitance Cd of the driving capacitor 10B is increased and the device voltage is decreased such that the device voltage approaches the device voltage of the reference capacitor 40. Through control of the driving voltage in this manner, when the driving voltage is controlled such that the device voltage of the driving capacitor 10B and the device voltage of the reference capacitor 40 become the same, the capacitance Co of the externally connected capacitor 10A can be controlled to become a desired capacitance.

As described above, by using the configuration and driving voltage control of the present preferred embodiment, a variable capacitance device utilizing a MEMS component can always be set to realize a desired capacitance. Further, when a pulse signal is used to detect a capacitance as described in the present preferred embodiment, the capacitance can be accurately adjusted without a considerable change in the distance between the first driving electrode 111 and the second driving electrode 121 caused by the capacitance detection signal. This is because the present preferred embodiment utilizes the fact that, since the amount of electric charge supplied by a pulse signal is significantly small compared with the amount of electric charge supplied by a driving voltage and the movable plate 102, which has an appropriate response time constant, is negligibly displaced during a period, set to be sufficiently short including a transient response, over which a pulse signal is applied.

Next, a variable capacitance device according to a second preferred embodiment will be described with reference to the drawings.

Figure 3:
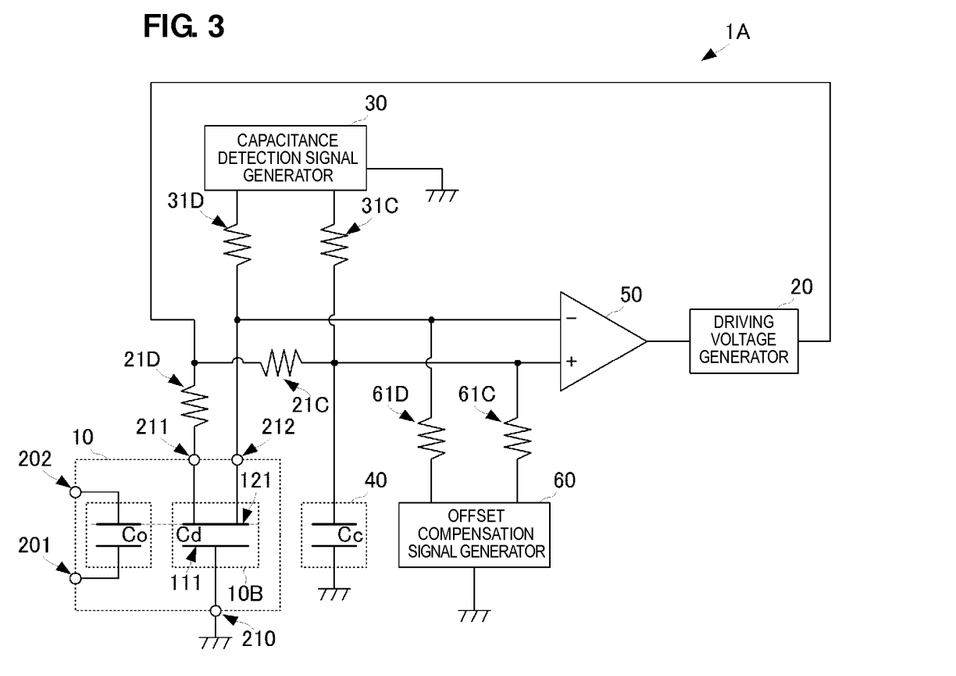
FIG. 3 is a circuit block diagram of the whole configuration of a variable capacitance device 1A of a second preferred embodiment of the present invention.

FIG. 3 is a circuit block diagram of the whole configuration of a variable capacitance device 1A according to the present preferred embodiment. The variable capacitance device 1A has a configuration in which an offset compensation signal generation unit 60 and resistors 61C and 61D are added to the variable capacitance device 1 described in the first preferred embodiment. Since the rest of the configuration is the same as that of the variable capacitance device 1 of the first preferred embodiment, only portions related to the offset compensation signal generation unit 60 will be described.

The offset compensation signal generation unit 60 generates an offset compensation signal. The offset compensation signal is a pulse signal obtained by reversing the sign of the capacitance detection signal that is output from the capacitance detection signal generation unit 30.

The offset compensation signal generation unit 60 is connected to the detection signal input port 212 of the MEMS mechanical unit 10 through the resistor 61D. In other words, the offset compensation signal generation unit 60 is connected to the second driving electrode 121 of the driving capacitor 10B through the resistor 61D and the detection signal input port 212. As a result, the offset compensation signal output from the offset compensation signal generation unit 60 is applied to the driving capacitor 10B.

In addition, the offset compensation signal generation unit 60 is connected to the reference capacitor 40 through the resistor 61C. As a result, the offset compensation signal output from the offset compensation signal generation unit 60 is also applied to the reference capacitor 40.

Here, since the offset compensation signal is a pulse signal obtained by reversing the sign of the capacitance detection signal as described above, an electric charge distribution generated in the driving capacitor 10B and the reference capacitor 40 caused by only the capacitance detection signal and an electric charge distribution generated in the driving capacitor 10B and the reference capacitor 40 caused by only the offset compensation signal are opposite to each other.

By utilizing the relationship between the capacitance detection signal and the offset compensation signal, and applying the offset compensation signal after application of the capacitance detection signal, the following operations and advantages are obtained in the present preferred embodiment.

Figure 4A:
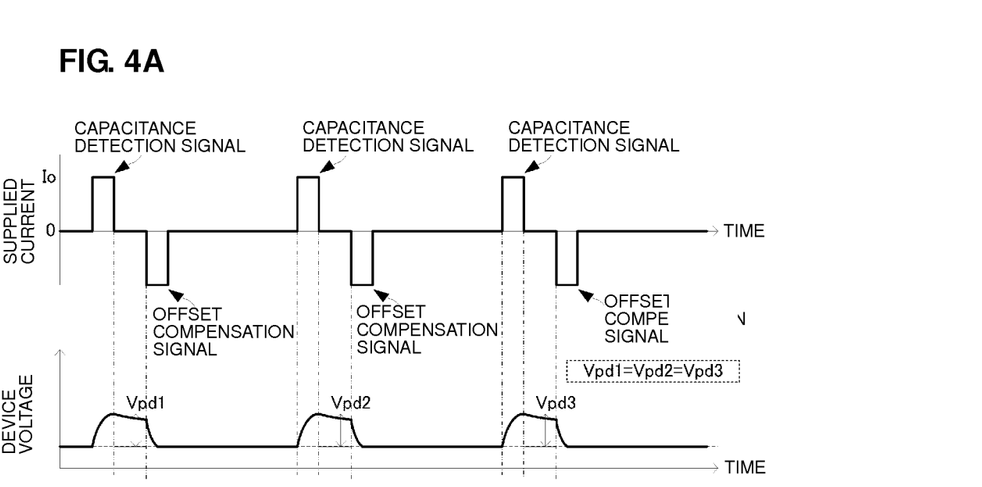
FIGS. 4A and 4B are diagrams for explaining the principle of variable-capacitance control of the second preferred embodiment of the present invention.
Figure 4B:
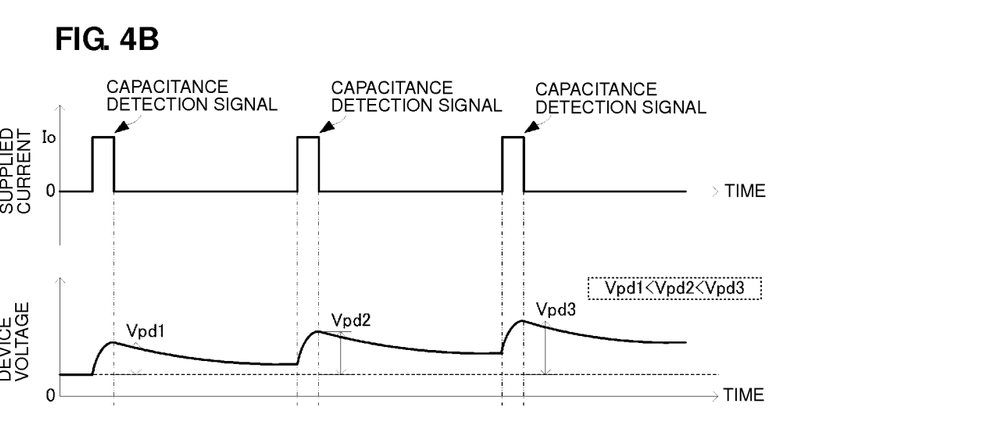

FIGS. 4A and 4B are diagrams for explaining the principle of the variable-capacitance control of the present preferred embodiment. FIG. 4A includes a current waveform diagram of the capacitance detection signal and offset compensation signal and a device voltage waveform diagram of the driving capacitor 10B and the reference capacitor 40 for the case of using the method of the present preferred embodiment. FIG. 4B includes a current waveform diagram of the capacitance detection signal and a waveform diagram of the device voltages of the driving capacitor 10B and the reference capacitor 40 for the case where the method of the first preferred embodiment is continuously used.

The configuration and method shown in the first preferred embodiment described above is suitable for capacitance control in the case where the capacitance control is performed only once or a very small number of times or the case where the capacitance control is repeated at sufficiently long intervals. However, when the method of the first preferred embodiment is performed continuously and repetitively at small intervals, the driving capacitor 10B and the reference capacitor 40 are charged every time the capacitance detection signal is applied, as illustrated in FIG. 4B. Such charging will cause additional driving voltage. As a result, referring to FIG. 4B, the device voltage will be increased in such a manner that $Vpd1 < Vpd2 < Vpd3$, where $Vpd1$, $Vpd2$, and $Vpd3$ are peak device voltages in sequence starting from the first application of the capacitance detection signal. This actually prevents accurate capacitance measurement based on the drive voltage from the driving voltage generation unit 20. In addition, the increase in the device voltage of the driving capacitor 10B causes variations in the capacitance of the externally connected capacitance Co.

On the other hand, in the method of the present preferred embodiment, the capacitance detection signal and the offset compensation signal are signals having opposite signs, and the offset compensation signal is applied after the capacitance detection signal has been applied, as illustrated in FIG. 4A. Hence, the electric charge supplied by the capacitance detection signal can be removed from the driving capacitor 10B and the reference capacitor 40.

As a result, assuming that the peak device voltages are Vpd1, Vpd2, and Vpd3 starting from the first application of the capacitance detection signal, the device voltages are always constant, i.e., Vpd1=Vpd2=Vpd3, as illustrated in FIG. 4A. Of course, the device voltages continue to be constant after this, when capacitance measurement is continued. By using each device voltage between a timing of applying the capacitance detection signal and a timing of applying the offset compensation signal, the capacitances are always measured accurately, even when the capacitance measurement is continued, such that accurate capacitance control is continued. Further, it becomes possible to accurately maintain the externally connected capacitance Co also during the control operation.

Next, a variable capacitance device according to a third preferred embodiment will be described with reference to the drawings.

Figure 5A:
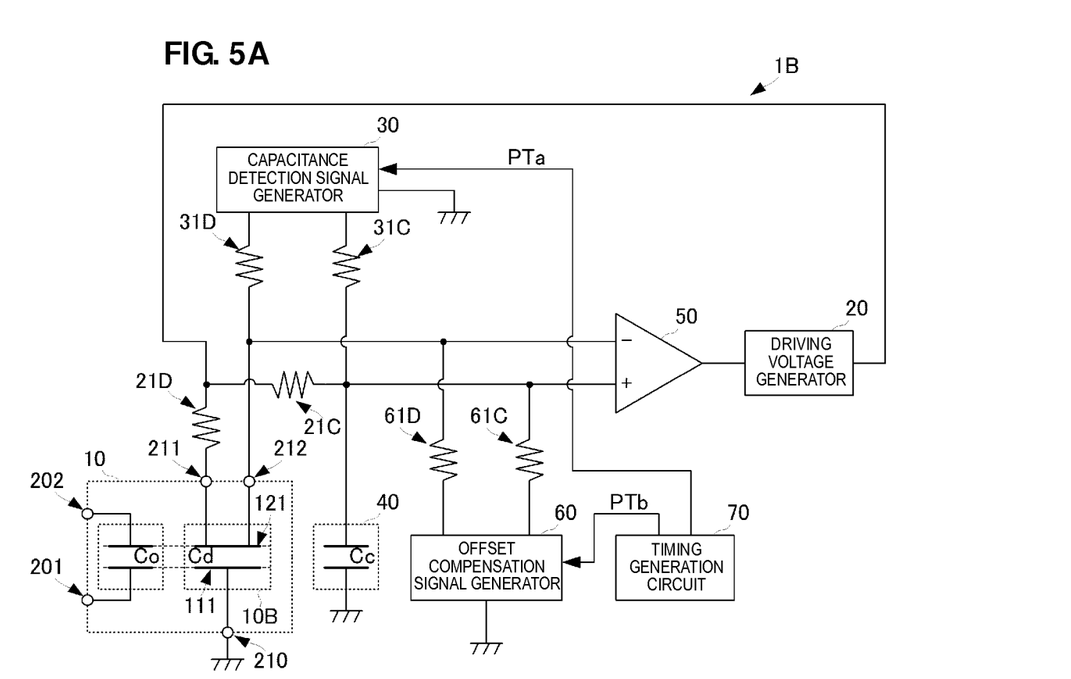
FIGS. 5A and 5B include a circuit block diagram of the whole configuration of a variable capacitance device 1B of a third preferred embodiment of the present invention, a waveform diagram of timing signals PTa and PTb, a current waveform diagram of a capacitance detection signal and an offset compensation signal, and a waveform diagram of the device voltages of a driving capacitor (corresponding to a driving capacitance) 10B and a reference capacitor (corresponding to a reference capacitance) 40.
Figure 5B:
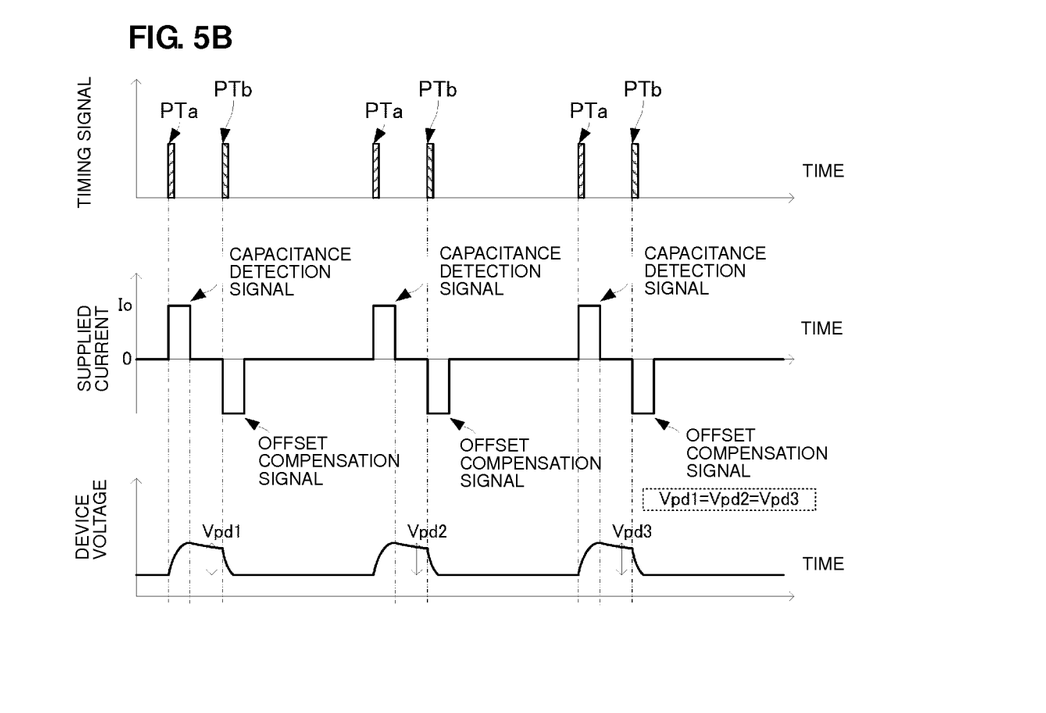

FIG. 5A is a circuit block diagram of the whole configuration of a variable capacitance device 1B according to the present preferred embodiment, and FIG. 5B includes a waveform diagram of timing signals PTa and PTb, a current waveform diagram of the capacitance detection signal and the offset compensation signal, and a waveform diagram of the device voltages of the driving capacitor 10B and the reference capacitor 40.

The variable capacitance device 1B of the present preferred embodiment shows a more specific exemplary circuit of the variable capacitance device 1A described in the second preferred embodiment and has a configuration in which a timing generation circuit 70 is added to the configuration of the variable capacitance device 1A.

The timing generation circuit 70 generates a timing signal PTa to generate the capacitance detection signal and a timing signal PTb to generate the offset compensation signal. Referring to the top diagram in FIG. 5B, the timing generation circuit 70 outputs the timing signal PTb after a predetermined period of time after outputting the timing signal PTa.

The timing generation circuit 70 applies the timing signal PTa to the capacitance detection signal generation unit 30 and applies the timing signal PTb to the offset compensation signal generation unit 60.

The capacitance detection signal generation unit 30 outputs the capacitance detection signal in accordance with the timing signal PTa. On the other hand, the offset compensation signal generation unit 60 outputs the offset compensation signal in accordance with the timing signal PTb.

Through the configuration and signal processing described above, the offset compensation signal can be applied to the driving capacitor 10B and the reference capacitor 40 after a predetermined period of time after the capacitance detection signal has been applied, as described in the second preferred embodiment.

Here, the interval between the timings at which the capacitance detection signals are applied (interval between the timing signals PTa) is set on the basis of a mechanical time constant of the movable plate 102. For example, it is preferable to set the interval to an interval about five times the time constant. The reason is as follows. In general, in a transient phenomenon with a certain time constant, 63% of the whole response occurs during a period equal to the time constant, and 99% of the whole response occurs during a period about five times the time constant. Hence, sufficient responsiveness is obtained against, for example, an external disturbance without generation of an excessive waiting time when the measurement of capacitance is performed with an interval five times the time constant, for example.

Further, the interval between the timing of applying the capacitance detection signal and the timing of applying the offset compensation signal is also set on the basis of the above-described time constant. For example, it is preferable to set the interval to an interval about half the time constant. This is because, when the interval is about half the time constant, an electric charge can be removed before the movable plate 102 is considerably displaced due to supply of an electric charge from the capacitance detection signal. As a result, continuous and accurate measurement and control of capacitance are realized without causing excessive displacement of the movable plate 102 to be generated due to the capacitance detection signal. Note that the signal timing and value may be appropriately set in accordance with the stability required for the externally connected capacitance Co.

Next, a variable capacitance device according to a fourth preferred embodiment will be described with reference to the drawings.

Figure 6A:
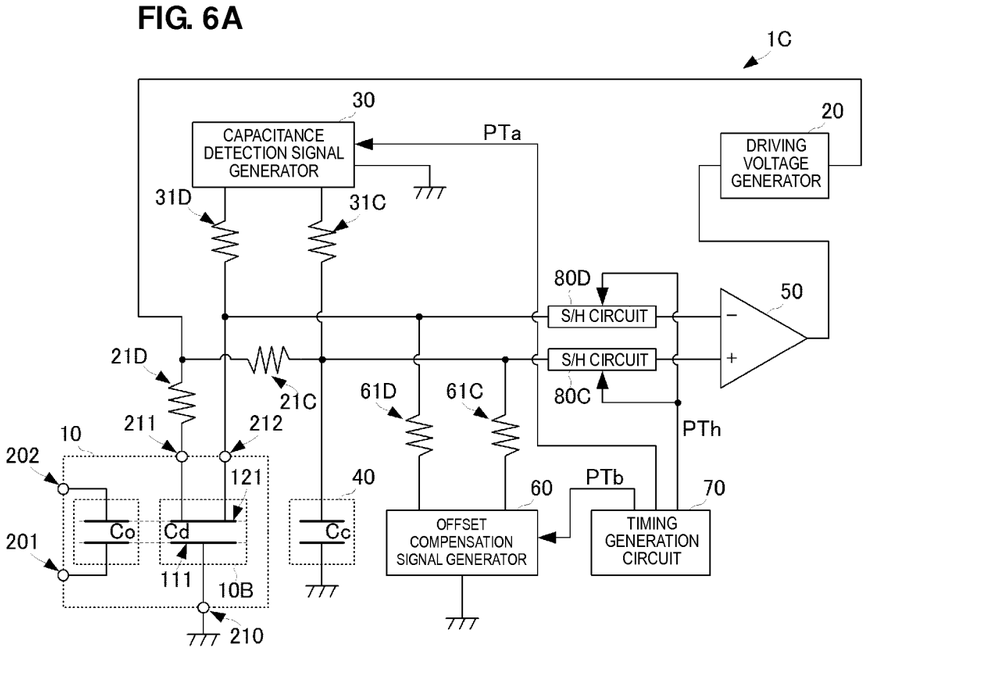
FIGS. 6A and 6B include a circuit block diagram of the whole configuration of a variable capacitance device 1C according to a fourth preferred embodiment of the present invention, a waveform diagram of timing signals PTa, PTb, and PTh, a current waveform diagram of a capacitance detection signal and an offset compensation signal, and a waveform diagram of the device voltages of the driving capacitor 10B and the reference capacitor 40.
Figure 6B:
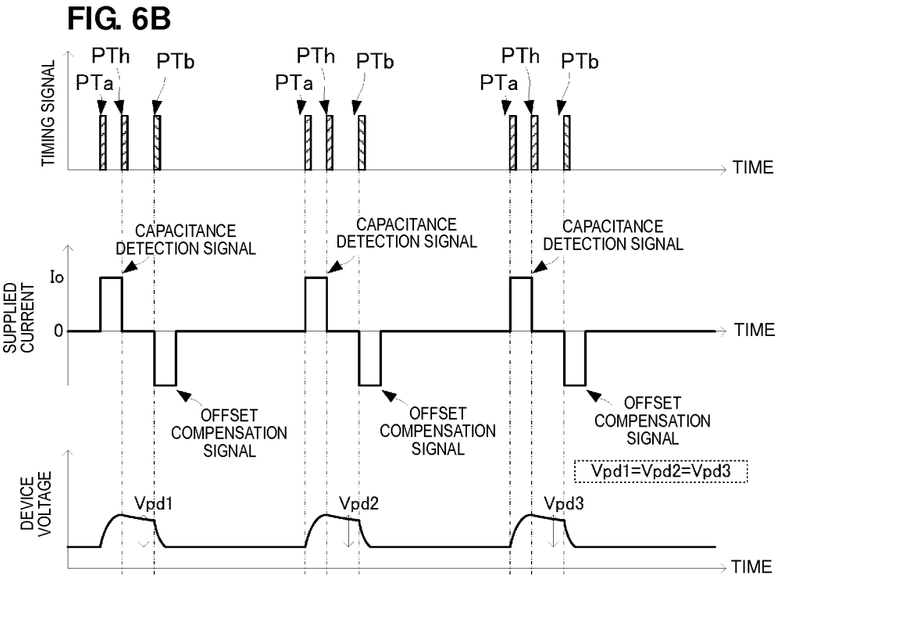

FIG. 6A is a circuit block diagram of the whole configuration of a variable capacitance device 1C according to the present preferred embodiment, and FIG. 6B includes a waveform diagram of timing signals PTa, PTb, and PTh, a current waveform diagram of the capacitance detection signal and the offset compensation signal, and a waveform diagram of the device voltages of the driving capacitor 10B and the reference capacitor 40.

The variable capacitance device 1C of the present preferred embodiment has a configuration in which sample/hold circuits (S/H circuits) 80C and 80D are added to the configuration of the variable capacitance device 1B described in the third preferred embodiment. Hence, only portions related to the sample/hold circuits 80C and 80D will be described hereinafter.

The timing generation circuit 70 generates the timing signal PTh to provide a sample/hold timing and supplies the signal to the sample/hold circuits 80C and 80D. At this time, the timing signal PTh is supplied at a predetermined timing between the timing signal PTa for generation of the capacitance detection signal and the timing signal PTb for generation of the offset compensation signal. For example, in the example of FIG. 6B, the predetermined timing is set to a timing that is approximately the same as the fall timing of the capacitance detection signal.

The sample/hold circuit 80D is connected to the inverting input terminal of the comparator 50. The sample/hold circuit 80D samples and holds the device voltage of the driving capacitor 10B and outputs this voltage to the inverting input terminal of the comparator 50.

The sample/hold circuit 80C is connected to the non-inverting input terminal of the comparator 50. The sample/hold circuit 80C samples and holds the device voltage of the reference capacitor 40 and outputs this voltage to the non-inverting input terminal of the comparator 50.

On the basis of the difference between the device voltage of the driving capacitor 10B which has been sampled and held and the device voltage of the reference capacitor 40 which has been sampled and held, the comparator 50 generates the above-described comparison output signal and outputs this signal to the driving voltage generation unit 20.

By using the configuration described above, the timing of comparing the device voltage of the driving capacitor 10B and the device voltage of the reference capacitor 40 can be set to a desired timing. As a result, stable control of the capacitance is possible.

Specifically, since changes in the device voltages for capacitance detection according to the configuration and method of various preferred embodiments of the present invention are transient phenomena, the device voltages may become unstable. However, by providing a sample/hold timing, detection of the difference between the device voltages, i.e., generation of the comparison output signal, avoiding any unstable period becomes possible, and stable capacitance control is realized.

Further, when the driving capacitor 10B and the reference capacitor 40 have nearly the same capacitance, the difference between the device voltages is very small and, hence, there may be a case in which the difference between the device voltages swings between positive and negative values. In this case, cluttering of the comparison output signal, such as a case in which the comparison output signal repeats the "Hi" level and the "Low" level in a short period, may be generated. However, through sampling and holding, such cluttering of the comparison output signal is significantly reduced and prevented. As a result, a stable comparison output signal is obtained and stable capacitance control is realized.

Further, even when external electrical disturbance is momentarily generated, an influence from the external disturbance can be removed through sampling and holding. As a result, a stable comparison output signal is obtained and stable capacitance control is realized.

Note that although the sample/hold timing is set to the fall timing of the capacitance detection signal in the example illustrated in FIG. 6B, any other timing between the timing of applying the capacitance detection signal and the timing of applying the offset compensation signal may be used. By setting the sample/hold timing to the fall timing of the capacitance detection signal, the difference between the device voltage of the driving capacitor 10B and the device voltage of the reference capacitor 40 becomes approximately maximum and, hence, a more stable comparison output signal is obtained by using this setting of the timing.

Next, a variable capacitance device according to a fifth preferred embodiment will be described with reference to the drawings.

Figure 7:
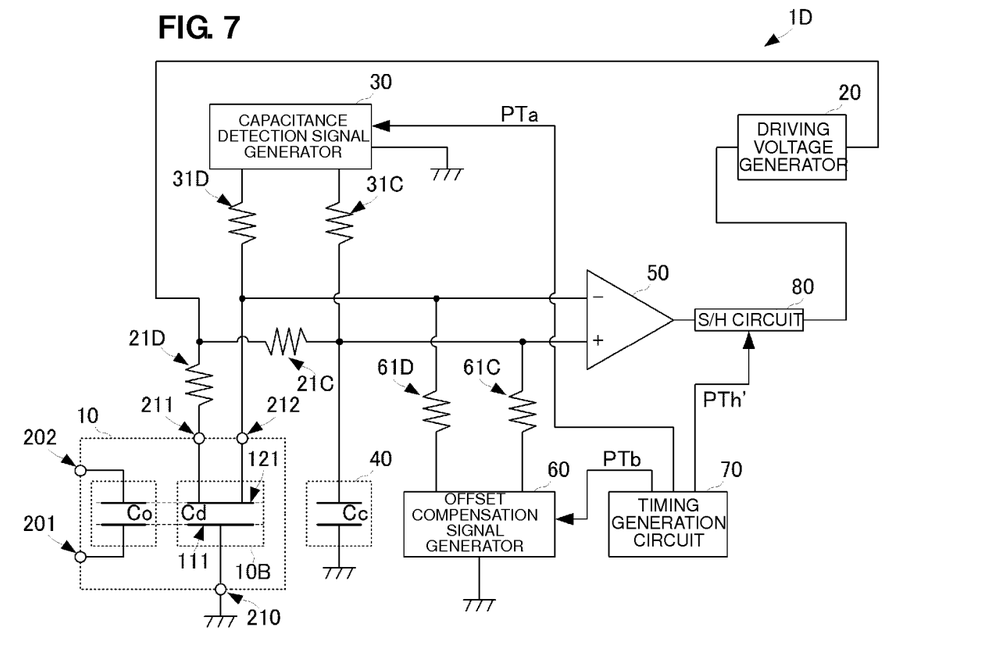
FIG. 7 is a circuit block diagram of the whole configuration of a variable capacitance device 1D of a fifth preferred embodiment of the present invention.

FIG. 7 is a circuit block diagram of the whole configuration of a variable capacitance device 1D according to the present preferred embodiment. The variable capacitance device 1D shows a case in which a sample/hold circuit (S/H) 80 is connected to the output side of the comparator 50 in the variable capacitance device 1C described in the fourth preferred embodiment.

The sample/hold circuit 80 is connected between the comparator 50 and the driving voltage generation unit 20. A timing signal PTh' for sampling and holding is applied to the sample/hold circuit 80 from the timing generation circuit 70. The timing of applying the timing signal PTh' is set to a timing that is approximately the same as the timing of applying the timing signal PTh described in the above-described fourth preferred embodiment. Note that, at this time, the timing of applying the timing signal PTh' in the present preferred embodiment may be set to a timing that is delayed by a signal delay time generated in the comparator 50 compared with the timing of applying the timing signal PTh in the third preferred embodiment.

The configuration in which the sample/hold circuit is connected to a stage subsequent to the comparator 50 in this manner also allows stable capacitance control to be realized similarly to the fourth preferred embodiment.

Next, a variable capacitance device according to a sixth preferred embodiment will be described with reference to the drawings.

Figure 8:
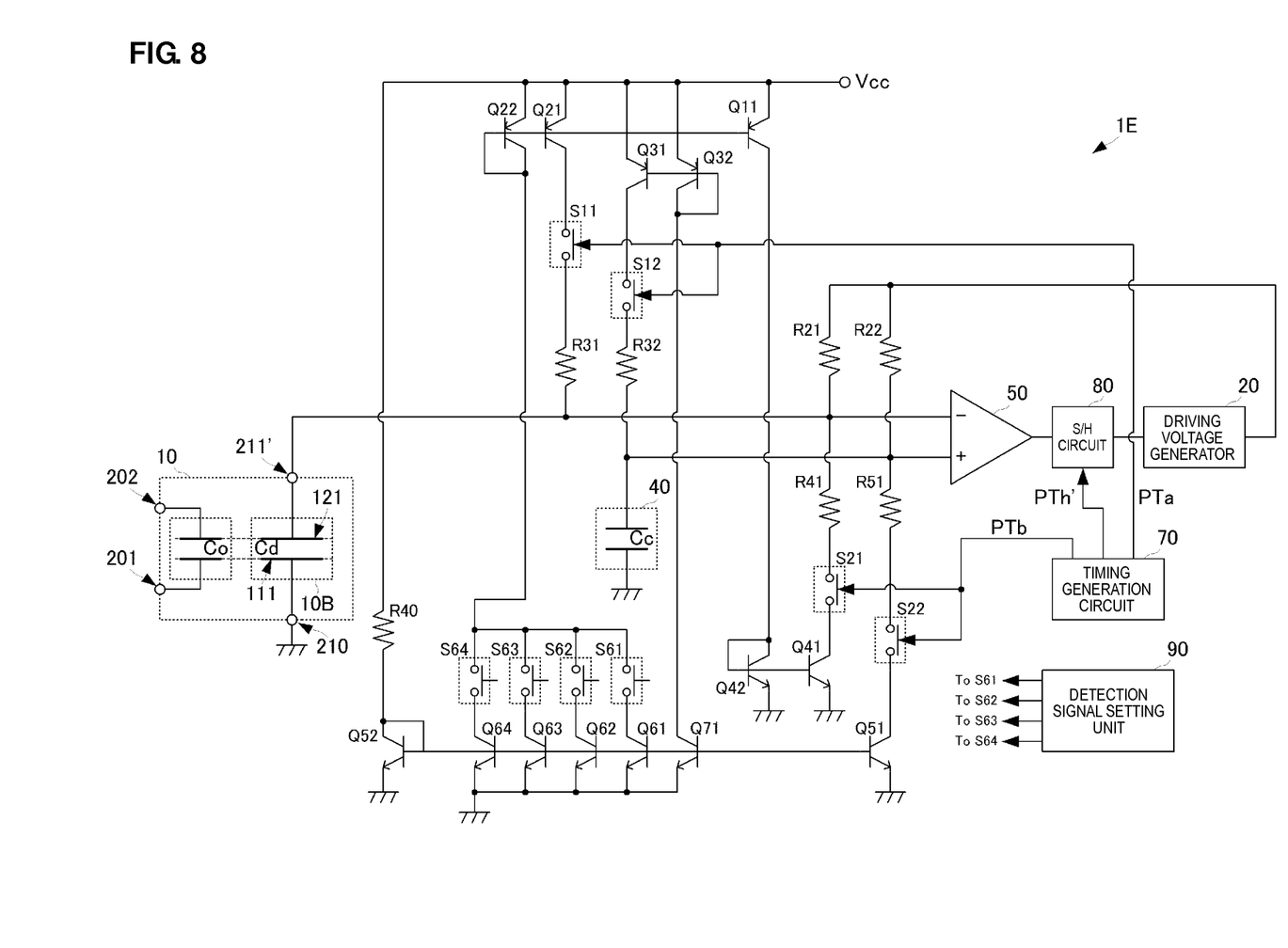
FIG. 8 is a circuit diagram of a variable capacitance device 1E of a sixth preferred embodiment of the present invention.

FIG. 8 is a circuit diagram of a variable capacitance device 1E according to the present preferred embodiment. The variable capacitance device 1E of the present preferred embodiment has a configuration in which the variable capacitance device 1D described in the fifth preferred embodiment has been more specifically realized using an IC and a magnitude of the capacitance detection signal can be selected from among a plurality of values.

Note that although the specific circuits of the driving voltage generation unit 20, the timing generation circuit 70, and the sample/hold circuit 80 are not illustrated, appropriate known circuit configurations that realize the functions described in the above-described preferred embodiments can be used.

A detection signal setting unit 90, whose specific configuration is not illustrated, supplies on/off control signals to switches S61, S62, S63, and S64 in accordance with capacitance control information received from an externally connected circuit, such as the control unit of a mobile communication terminal. A known configuration that generates the on/off control signals can be used as the internal circuit configuration of the detection signal setting unit 90.

A driving voltage input terminal Vcc, which is connected to a driving voltage source, is connected to the collector of an npn transistor Q52 through a resistor R40. The emitter of the npn transistor Q52 is connected to the ground.

(A) Capacitance Detection Signal Generation Circuit (A-1) Capacitance Detection Signal Generation Circuit for Driving Capacitor 10B The base of the npn transistor Q52 is connected to the collector of the npn transistor Q52 and to npn transistors Q71, Q61, Q62, Q63, and Q64. The emitters of these npn transistors Q71, Q61, Q62, Q63, and Q64 are connected to the ground. This configuration defines current mirror circuits with the npn transistor Q52 as a common transistor.

The emitter of the npn transistor Q61 is connected to one end of a switch S61, and the emitter of the npn transistor Q62 is connected to one end of a switch S62. The emitter of the npn transistor Q63 is connected to one end of a switch S63, and the emitter of the npn transistor Q64 is connected to one end of a switch S64.

The other ends of the switches S61, S62, S63, and S64 are connected to one another and are connected to the collector of a pnp transistor Q22.

The emitter of the pnp transistor Q22 is connected to the driving voltage input terminal Vcc. The base of the pnp transistor Q22 is connected to the collector of the pnp transistor Q22 and to the base of a pnp transistor Q21. The emitter of the pnp transistor Q21 is connected to the driving voltage input terminal Vcc. This configuration defines a current mirror circuit including the pnp transistors Q22 and Q21.

The collector of the pnp transistor Q21 is connected to one end of a switch S11. The other end of the switch S11 is connected to the second driving electrode 121 of the driving capacitor 10B of the MEMS mechanical unit 10 through a resistor R31. The second driving electrode 121 is connected to the inverting input terminal of the comparator 50. The second driving electrode 121 is connected to the output end of the driving voltage generation unit 20 through a resistor R21. The first driving electrode 111 of the driving capacitor 10B is connected to the ground.

As a result of this configuration, the capacitance detection pulse signal, as a constant current signal, in accordance with the on-operation of the switch S11 is supplied to the driving capacitor 10B.

(A-2) Capacitance Detection Signal Generation Circuit for Reference Capacitor 40

On the other hand, the collector of the npn transistor Q71 is connected to the collector of a pnp transistor Q32.

The emitter of the pnp transistor Q32 is connected to the driving voltage input terminal Vcc. The base of the pnp transistor Q32 is connected to the collector of the pnp transistor Q32 and to the base of a pnp transistor Q31. The emitter of the pnp transistor Q31 is connected to the driving voltage input terminal Vcc. This configuration defines a current mirror circuit including the pnp transistors Q22 and Q21.

The collector of the pnp transistor Q31 is connected to one end of the switch S12. The other end of the switch S12 is connected to one end of the reference capacitor 40 through a resistor 32. Note that the one end of the reference capacitor 40 connected to the non-inverting end of the comparator 50. The one end of 40 is connected to the output end of the driving voltage generation unit 20 through a resistor R22. Note that the other end of the reference capacitor 40 is connected to the ground.

As a result of this configuration, the capacitance detection pulse signal, as a constant current signal, in accordance with the on-operation of a switch S12 is supplied to the reference capacitor 40.

By supplying the timing signal PTa to the switches S11 and S12 and synchronizing the on-operation of the switch S11 and the on-operation of the switch S12, the capacitances of the driving capacitor 10B and the reference capacitor 40 can be measured and compared.

(A-3) Variable Setting of Capacitance Ratio

Through on/off operation of the switches S61 to S64 described above, the current supplied to the driving capacitor 10B can be controlled. For example, the ratios of the current capacities of the npn transistors Q61, Q62, Q63, and Q64 with respect to the npn transistor Q71 are respectively set to 1:1, 1:2, 1:4, and 1:8. As a result of this configuration, through combination of ON switches among the switches S61, S62, S63, and S64, the ratio of a current supplied to the driving capacitor 10B to a current supplied to the reference capacitor 40 can be set in 16 ways. Hence, a plurality of capacitance ratios to be detected can be set using the single reference capacitor 40. As a result, a plurality of capacitances can be controlled using the single reference capacitor 40.

(B) Offset Compensation Signal Generation Circuit (B-1) Offset Compensation Signal Generation Circuit for Driving Capacitor 10B The base of a pnp transistor Q11 is connected to the base of the pnp transistor Q22 described above, and the emitter of the pnp transistor Q11 is connected to the driving voltage input terminal Vcc. This configuration defines a current mirror circuit including the pnp transistors Q22 and Q11. The collector of the pnp transistor Q11 is connected to the collector of a npn transistor Q42. As a result, a current in accordance with the combination of the npn transistors Q61 to Q64 is supplied to the npn transistor Q42.

The emitter of the npn transistor Q42 is connected to the ground. The base of the npn transistor Q42 is connected to the collector of the npn transistor Q42 and to the base of an npn transistor Q41. The emitter of the npn transistor Q41 is connected to the ground. This configuration defines a current mirror circuit including the npn transistors Q42 and Q41.

The collector of the npn transistor Q41 is connected to one end of a switch S21. The other end of the switch S21 is connected to the second driving electrode 121 of the driving capacitor 10B through a resistor R41.

As a result of this configuration, the offset compensation pulse signal, as a constant current signal, flows through the driving capacitor 10B in accordance with the on-operation of the switch S21. At this time, since the offset compensation signal is a signal with a reverse current, i.e., an opposite-sign signal with respect to the above-described capacitance detection signal, the electric charge stored in the driving capacitor 10B by the capacitance detection signal can be removed as a result of the offset compensation signal flowing through the driving capacitor 10B.

(B-2) Offset Compensation Signal Generation Circuit for Reference Capacitor 40

The base of an npn transistor Q51 is connected to the base of the above-described npn transistor Q52. The emitter of the npn transistor Q51 is connected to the ground. This configuration defines a current mirror circuit including the npn transistors Q52 and Q51.

The collector of the npn transistor Q51 is connected to one end of a switch S22. The other end of the switch S22 is connected to one end of the reference capacitor 40 through a resistor R51.

As a result of this configuration the offset compensation pulse signal in accordance with the on-operation of the switch S22 flows through the reference capacitor 40. At this time, since the offset compensation signal is a signal with a reverse current, i.e., an opposite-sign signal with respect to the above-described capacitance detection signal, the electric charge stored in the reference capacitor 40 by the capacitance detection signal can be removed as a result of the offset compensation signal flowing through the reference capacitor 40.

At this time, the same timing signal PTb is applied to the switches S21 and S22. As a result, the electric charges stored in the driving capacitor 10B and the reference capacitor 40 by the capacitance detection signal can be similarly removed.

As described above, by using the configuration of the present preferred embodiment, stable capacitance control is realized and the driving capacitor 10B, in other words, the externally connected capacitance Co of the variable capacitance device can be controlled using the single reference capacitor 40 so as to have any one of a plurality of controllable capacitances. Hence, there is no need to form an entire capacitance control circuit individually for every desired value of the capacitance Co, resulting in a reduction in the size of the whole variable capacitance device.

In the present preferred embodiment, a circuit configuration that enables a variable ratio of a current supplied to the driving capacitor 10B to a current supplied to the reference capacitor 40 has been described. However, when a configuration is used in which a constant current is supplied, it is sufficient to use a single npn transistor instead of the npn transistors Q61 to Q64 and provide a current mirror circuit including the npn transistor Q41 and the npn transistor Q52, by omitting the pnp transistor Q11 and the npn transistor Q42. This allows the circuit to be simplified.

Further, the above-described configuration that enables a variable ratio of supplied voltages can be realized by omitting only the pnp transistor Q11 and providing a current mirror circuit including the npn transistor Q41 and the npn transistor Q52, and by controlling the on period of the switch S21 separately from the on period of the switch S22.

In the present preferred embodiment, an example has been described in which control of a plurality of capacitances is realized by the currents supplied to the driving capacitor 10B and the reference capacitor 40. However, the control of a plurality of capacitances can be also similarly realized by making the reference capacitor 40 be a variable capacitance device using, for example, an array of parallel capacitors with switches. In this case, a single npn transistor is used instead of the npn transistors Q61 to Q64, the capacitance of the variable capacitance device is controlled so as to be variable, and the on periods of the switches S21 and S22 are controlled in accordance with a set variable capacitance.

Further, it is possible to detect a plurality of capacitances through the on-operation periods of the switches S11 and S22 while using a single npn transistor instead of the npn transistors Q61 to Q64 and using only the single reference capacitor 40. In this case, it is sufficient to set the on-operation periods of the switches S21 and S22 in accordance with the on-operation periods of the switches S11 and S12.

In the preferred embodiments described above, configurations have been described which preferably include resistors (resistors 31C, 31D, 61C, and 62D or resistors corresponding to these, i.e., resistors R31, R32, R41, and R51 in FIG. 8) provided at the output ends of the capacitance detection signal generation unit 30 and the offset compensation signal generation unit 60). However, these resistors can be omitted. By omitting these resistors, changes in the device voltages of the driving capacitor 10B and the reference capacitor 40 become more linear. This allows faster responses of the circuits to be realized.

In the descriptions above, configurations that preferably include the timing generation circuit 70 have been shown. However, by detecting a change in current at the output end of the capacitance detection signal generation unit 30, for example, the offset compensation signal generation unit 60 and the sample/hold circuits 80, 80C, 80D may be made to operate using the change in current as a trigger.

In the descriptions above, examples of electrostatically driven variable capacitance devices have been shown. However, the above-described capacitance control can be also applied to piezoelectric-driven variable capacitance devices that use a piezoelectric material.

In the descriptions above, examples have been shown in which the movable plate is a high-resistance silicon substrate, and the second driving electrode and the second variable capacitance forming electrode are provided on the surface of the substrate. However, the above-described capacitance control can be applied to a configuration in which the whole movable plate is preferably made of low-resistance silicon, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A variable capacitance device comprising:
a fixed plate including a first driving electrode and a first variable capacitance electrode;
a movable plate including a second driving electrode facing the first driving electrode and a second variable capacitance electrode facing the first variable capacitance electrode;
a driving voltage applying unit that applies a driving voltage between the first driving electrode and the second driving electrode;
a reference capacitor having a predetermined capacitance;
a capacitance detection signal generation unit that applies a capacitance detection pulse signal to a driving capacitance portion including the first driving electrode and the second driving electrode and to the reference capacitor; and
a voltage change comparator that compares a voltage change of the driving capacitance portion and a voltage change of the reference capacitor caused by the capacitance detection pulse signal and outputs a comparison result; wherein
the driving voltage applying unit controls the driving voltage based on the comparison result.

2. The variable capacitance device according to claim 1, further comprising an offset compensation signal generation unit that applies a compensation signal obtained by reversing a sign of the capacitance detection pulse signal supplied to the driving capacitance portion and the reference capacitor.

3. The variable capacitance device according to claim 2, further comprising a timing generation unit that applies application timing signals to the capacitance detection signal generation unit and the offset compensation signal generation unit, wherein the capacitance detection signal generation unit and the offset compensation signal generation unit apply the respective signals in accordance with the timing signals.

4. The variable capacitance device according to claim 3, further comprising a sample/hold circuit on an input side or an output side of the voltage change comparator, wherein the timing generation unit provides a hold timing to the sample/hold circuit and the sample/hold circuit performs sampling/holding based on the provided hold timing.

5. The variable capacitance device according to claim 1, further comprising a current ratio control unit that controls a ratio of a current supplied to the driving capacitance portion to a current supplied to the reference capacitor.

* * * * *